(12) United States Patent
Guevara et al.

(10) Patent No.: US 12,543,588 B2
(45) Date of Patent: Feb. 3, 2026

(54) ALLOY FOR METAL UNDERCUT REDUCTION

(71) Applicant: TEXAS INSTRUMENTS INCORPORATED, Dallas, TX (US)

(72) Inventors: Rafael Jose Guevara, Makati (PH); Jessamae Grate, Mabalacat (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 416 days.

(21) Appl. No.: 18/174,693

(22) Filed: Feb. 27, 2023

(65) Prior Publication Data
US 2024/0290735 A1 Aug. 29, 2024

(51) Int. Cl.
*H01L 23/00* (2006.01)

(52) U.S. Cl.
CPC .............. *H01L 24/03* (2013.01); *H01L 24/05* (2013.01); *H01L 24/08* (2013.01); *H01L 24/11* (2013.01); *H01L 24/13* (2013.01); *H01L 24/16* (2013.01); *H01L 24/81* (2013.01); *H01L 2224/0345* (2013.01); *H01L 2224/0346* (2013.01); *H01L 2224/03502* (2013.01); *H01L 2224/03831* (2013.01); *H01L 2224/03848* (2013.01); *H01L 2224/03912* (2013.01); *H01L 2224/0401* (2013.01); *H01L 2224/05082* (2013.01); *H01L 2224/05083* (2013.01); *H01L 2224/05118* (2013.01); *H01L 2224/05147* (2013.01); *H01L 2224/05155* (2013.01); *H01L 2224/05166* (2013.01); *H01L 2224/05184* (2013.01); *H01L 2224/05573* (2013.01); *H01L 2224/05618* (2013.01); *H01L 2224/05647* (2013.01); *H01L 2224/05655* (2013.01); *H01L 2224/11462* (2013.01); *H01L 2224/11831* (2013.01); *H01L 2224/13083* (2013.01); *H01L 2224/13147* (2013.01); *H01L 2224/13155* (2013.01); *H01L 2224/13164* (2013.01); *H01L 2924/0132* (2013.01)

(58) Field of Classification Search
CPC ......... H01L 24/03; H01L 24/05; H01L 24/08; H01L 24/11; H01L 24/13; H01L 24/16; H01L 24/81; H01L 2224/0345; H01L 2224/03502; H01L 2224/03831; H01L 2224/03848; H01L 2224/03912; H01L 2224/0401; H01L 2224/05082; H01L 2224/05083; H01L 2224/05118; H01L 2224/05147; H01L 2224/05155; H01L 2224/05166; H01L 2224/05184; H01L 2224/05573; H01L 2224/05618; H01L 2224/05647; H01L 2224/05655; H01L 2224/11462; H01L 2224/11831; H01L 2224/13083; H01L 2224/13147; H01L 2224/13155; H01L 2224/13164; H01L 2924/0132
See application file for complete search history.

*Primary Examiner* — Marcos D. Pizarro
(74) *Attorney, Agent, or Firm* — Ronald O. Neerings; Frank D. Cimino (57) ABSTRACT

A method includes forming a seed layer on a substrate. The seed layer includes a first metal. The method also includes forming a first metal layer over the seed layer. The first metal layer includes a second metal. The method further includes forming a second metal layer over the first metal layer. The second metal layer includes the first metal. The method includes converting at least a portion of the first metal layer into an alloy of the first metal and the second metal. The seed layer is then etched.

10 Claims, 15 Drawing Sheets

ALLOY FOR METAL UNDERCUT REDUCTION

BACKGROUND

The formation of a metal (e.g., copper) pillar (also referred to as an interconnect) for a semiconductor die may include the wafer-level formation of a seed layer. Metal pillars are then formed over the seed layer. The seed layer electrically interconnects metal vias within the die to the metal pillar. The seed layer is then etched to remove the otherwise exposed portion of the seed layer. In some cases, a wet etching process (which may include an acid) is used to remove the exposed portion of the seed layer. Unfortunately, some of the seed layer under the metal pillars may also be removed during the wet etching process. The removal of the seed layer under a metal pillar is referred to as an "undercut." If a via is close to the outer edge of the metal pillar, an undercut may undesirably expose the via, thereby interfering with the electrical connectivity between the die and the metal pillar. If this happens, the die and possibly the entire wafer may need to be rejected.

SUMMARY

A method includes forming a seed layer on a substrate. The seed layer includes a first metal. The method also includes forming a first metal layer over the seed layer. The first metal layer includes a second metal. The method further includes forming a second metal layer over the first metal layer. The second metal layer includes the first metal. The method includes converting at least a portion of the first metal layer into an alloy of the first metal and the second metal. The seed layer is then etched.

An apparatus includes a substrate having a first surface and includes a seed layer over the first surface. The seed layer has a second surface opposite the first surface. The apparatus further includes an alloy over the second surface. The alloy has a third surface opposite the second surface. A conductive pillar is over the third surface.

BRIEF DESCRIPTION OF THE DRAWINGS

FIGS. 2A-9B are example interim cross-sectional views illustrating the formation of a bond over active circuit (BOAC) pillar and a copper over anything (COA) pillar in which an alloy is included to reduce seed layer undercut underneath the pillars.

DETAILED DESCRIPTION

The same reference numbers or other reference designators are used in the drawings to designate the same or similar (either by function and/or structure) features.

Figure 1:
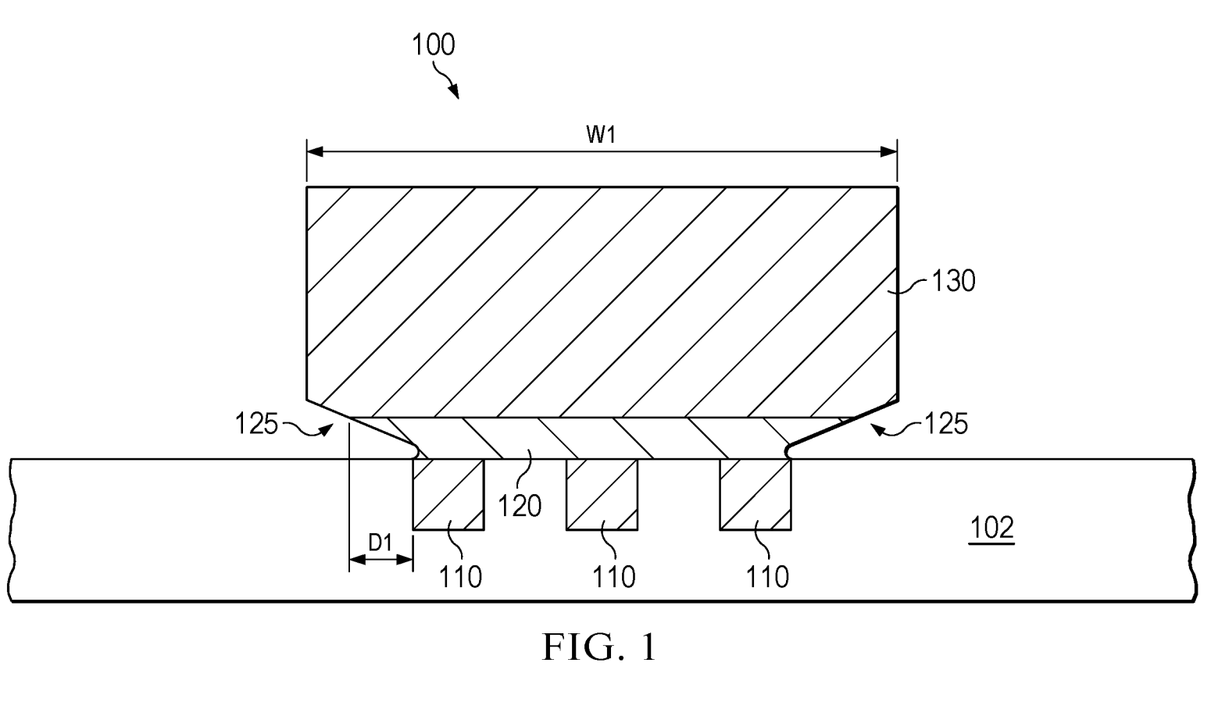
FIG. 1 is a cross-sectional view of a semiconductor die with severe undercut which may expose one or more vias under a metal pillar, in an example.

FIG. 1 is a schematic diagram of a cross-sectional view of an example integrated circuit (IC) 100. The IC 100 includes a semiconductor die 102 on which a metal pillar 130 is formed. Pillar 130 is electrically coupled to one more vias 110 within the die 102. The vias 110 interconnect a metal layer (not shown) within the die 102 to the pillar 130. External connectivity to pillar 130 may be made using, for example, a bond wire, a solder bump, or the like.

A seed layer 120 is formed between pillar 130 and the die 102 and provides electrical connectivity between the die's vias 110 and pillar 130. The seed layer 120 may be formed from any suitable material. In one example, the seed layer 120 includes a layer of copper (Cu) on top of a layer of titanium-tungsten (TiW). The seed layer 120 may be formed on the semiconductor die 102 by, for example, sputter deposition or another suitable technique.

Although only a portion of the seed layer 120 is shown in FIG. 1, the seed layer 120 may be applied across the surface of the wafer before the wafer is singulated into individual dies. Following formation of the seed layer 120 across the wafer, the metal pillars 130 are formed over the seed layer 120. At this point in the fabrication process, some of the seed layer 120 is between the die 102 and the pillars 130 and the rest of the seed layer 120 is exposed (i.e., not under the metal pillars).

After pillars 130 are formed over the seed layer 120, the exposed portions of the seed layer are removed by any suitable process. One example process is wet etching in which an acid (e.g., sulphuric acid or phosphoric acid) is used to etch away the exposed portion of the seed layer 120 leaving in place on the semiconductor die that portion of the seed layer 120 between the metal pillars 130 and the die, as shown in FIG. 1. The wet etching process may remove that portion of the seed layer 120 the acid reaches as well as some of the structure of the pillar 130 (which may include Cu) that the acid reaches. As a result of the wet etching process, an undercut 125 may form at the sides of the metal pillar 130. Unfortunately, the undercut 125 may extend from the outer edge of the metal pillar 130 to one or more of the vias 110. If that happens, the via 110 may not establish sufficient electrical connectivity between the die 102 and the metal pillar 130 resulting in a continuity failure, also referred to as a "leakage failure." The existence of a leakage failure may cause the die 102 or possibly the entire wafer to fail an acceptance test in which case the wafer is rejected.

Sever undercuts resulting in leakage failures may be reduced by carefully controlling the time duration of the wet etching process and/or controlling the nozzle angle and position from which the acid flows onto the wafer, but potentially damaging undercuts 125 may be still occur. Further, the width W1 of the metal pillar 130 can be increased to thereby increase the distance D1 between the edge of the metal pillar 130 and the closest via 110 to further reduce possibility of an undercut 125 impacting the via 110. Despite such techniques, undercuts 125 may still occur.

The example described herein reduces or eliminates undercuts 125 through the use of an alloy layer between the seed layer 120 and the metal pillar. The alloy layer is resistance to the wet etching process and helps to prevent the seed layer 120 under the metal pillar from being undercut during wet etching. FIGS. 2-9B illustrate a time sequence of processing steps of a wafer to include such an alloy when forming metal pillars on a semiconductor die. The processing steps shown are for both a "bond over active circuit" (BOAC) metal interconnect and a "copper over anything" (COA) metal pillar. The initial processing is the same for both BOAC and COA metal pillars as illustrated in FIGS. 2A-5. FIGS. 6A, 7A, 8A, and 9A are specific to the further processing steps for a BOAC metal pillar. FIGS. 6B, 7B, 8B, and 9B are specific to the further processing steps for a COA metal pillar. FIGS. 2A-9B show the processing of an individual die on the wafer, but the processing steps illustrated may be performed across some or all of the wafer.

Figures 2A, 2B:
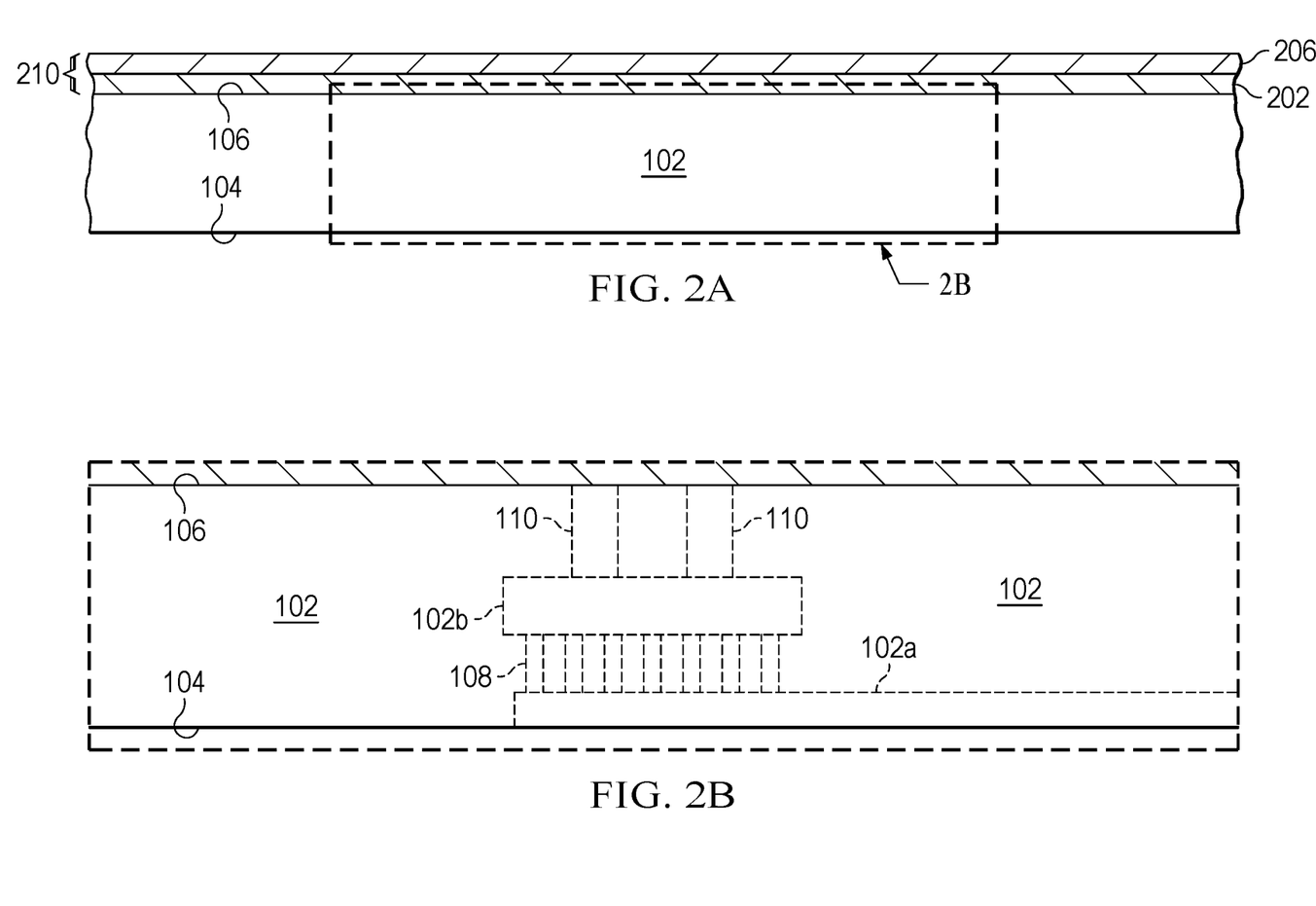

In FIG. 2A, the seed layer 210 is formed on a surface of a substrate such as the semiconductor die 102. The semiconductor die 102 may be formed as an arrangement of metal and dielectric layers. Each metal layer may include aluminum, copper, or any other suitable conductive material. Each dielectric layer may include an oxide (e.g., silicon dioxide) or other suitable electrically insulative material. Layers including other types of materials also may be included within the die 102. FIG. 2B shows an example of the die's metal layers as including metal layer 102a and 102b. A dielectric layer (not specifically shown) may separate metal layers 102a and 102b. The die 102 may include one more additional metal layers besides layers 102a and 102b shown in FIG. 2B. Active components (e.g., transistors) and passive components (e.g., resistors, capacitors, inductors) may be formed among the various metal and dielectric layers. Such components may be combined to form digital circuits such as logic gates, flip-flops, etc., analog circuits such as amplifiers, filters, etc., and/or a combination of digital and analog circuits. Metal vias 108 may interconnect the die's metal layers 102a and 102b. The vias 110 described above may be formed to interconnect a portion of metal layer 102b to a metal pillar, formed as describe herein.

In this example, the seed layer 210 includes a layer 202 formed on the semiconductor die 102 and another layer 206 formed over layer 202. Each layer 202 and 206 may be sputtered deposited on semiconductor die 102 (or another suitable deposition process). Layer 202 may include TiW. Layer 206 may include Cu.

Figure 3:
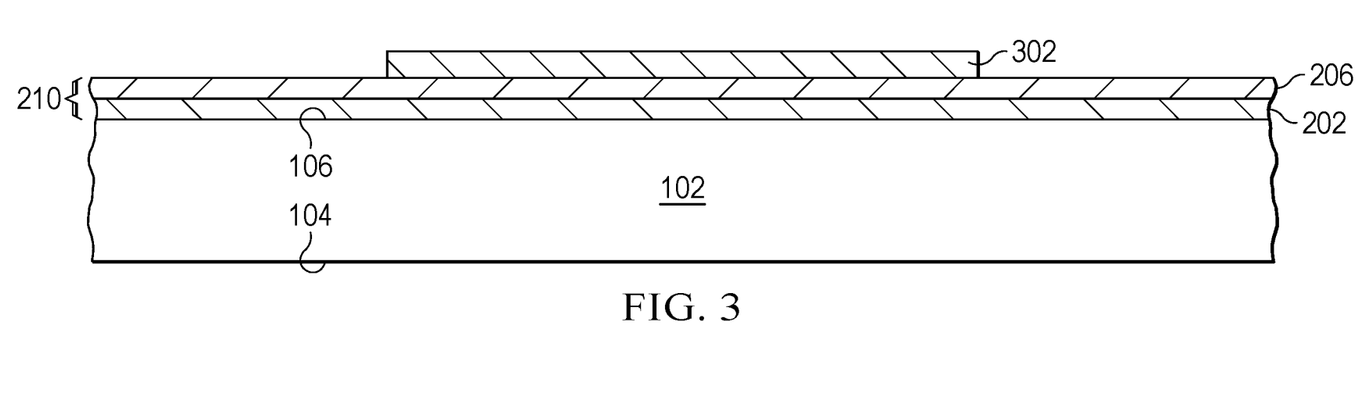

In the process step of FIG. 3, a metal layer 302 is formed on the seed layer 210, and specifically on layer 206 of the seed layer 210. Metal layer 302 includes a metal that is different type of metal than that included in layer 206 of the seed layer 210. For example, metal layer 302 may include nickel (Ni) and layer 206 of the seed layer may include Cu, as noted above. In other examples, metal layer 302 may include a metal other than Ni such as Zinc (Zn). As described below, the wafer is processed in such a way that metal layer 302 forms an alloy with layer 206 of the seed layer. The alloy is substantially resistant to the acid subsequently used to etch the seed layer 210. The metal used to form metal layer 302 is any metal that can form an alloy with the metal of layer 206 of the seed layer 210 that is resistant to the wet etching of the seed layer. The metal layer 302 may be selectively deposited over the seed layer 210 using, for example, a mask or polymer patterning. For example, a polymer can be coated, and the specific design or area intended for metal layer 302 can be exposed via ultraviolet light and developed using a solvent to expose the area. Metal layer 302 can then be deposited via, for example, sputtering or plating in the exposed area. The pattern of the metal layer 302 corresponds to the intended locations of the metal pillars to be formed on the wafer.

Figure 4:
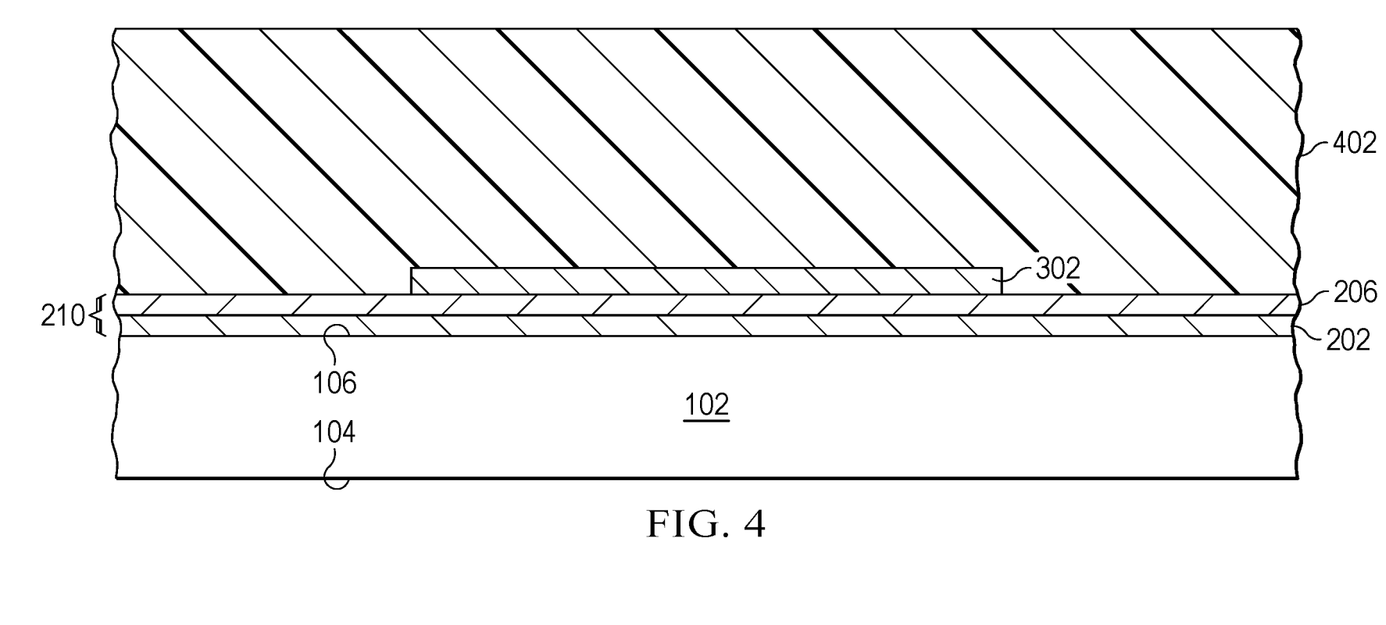
Figure 5:
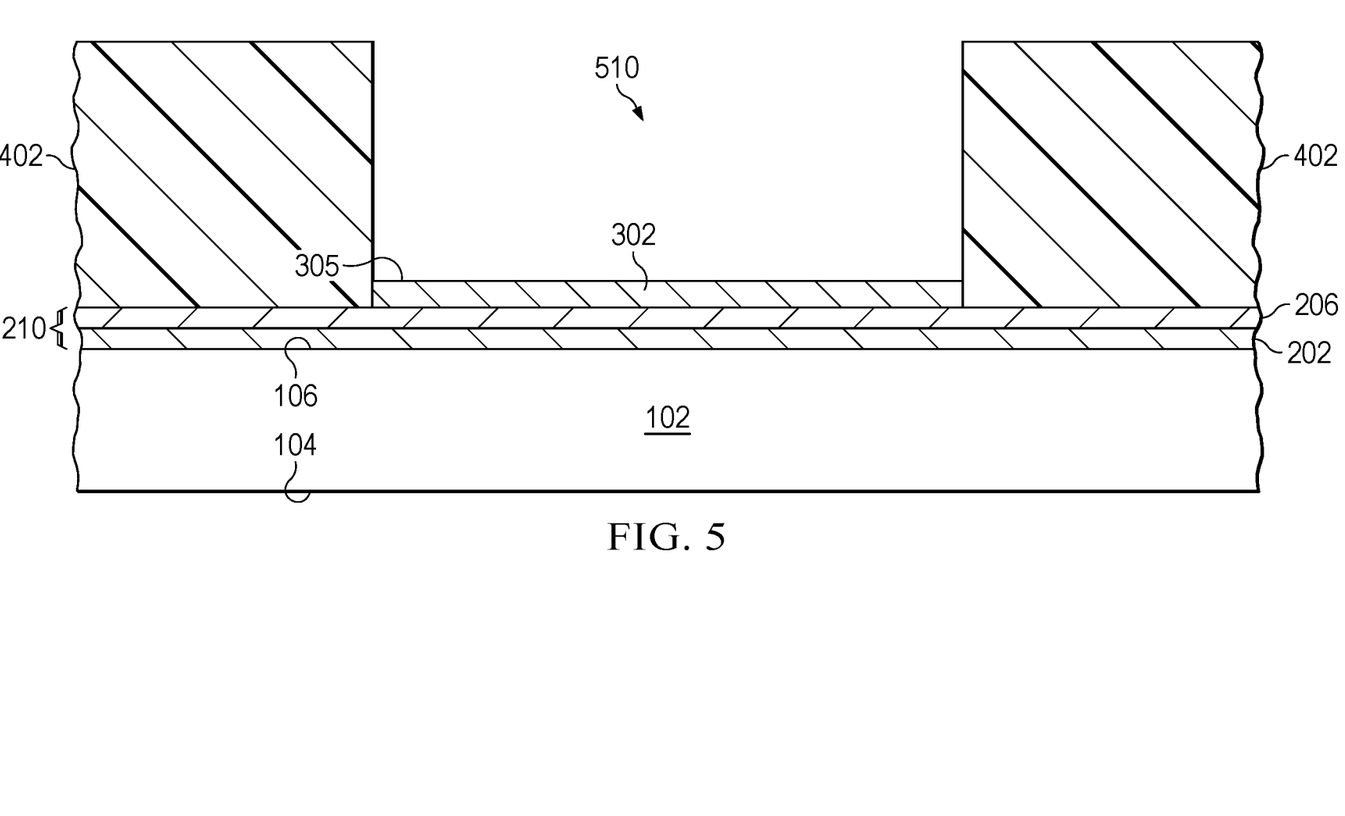

FIG. 4 illustrates coating the wafer with photoresist 402 or other suitable material usable to form a pattern on the wafer in which the metal pillars can be formed. A mask may be placed on the wafer. The photoresist that is exposed through the pattern may be exposed to ultraviolet light to remove the photoresist in the areas of the wafer at which metal pillars are to be formed. FIG. 5 shows an opening 510 in the photoresist 402 which is formed over the metal layer 302. The mask used to pattern the photoresist 402 is then removed.

Figure 6A:
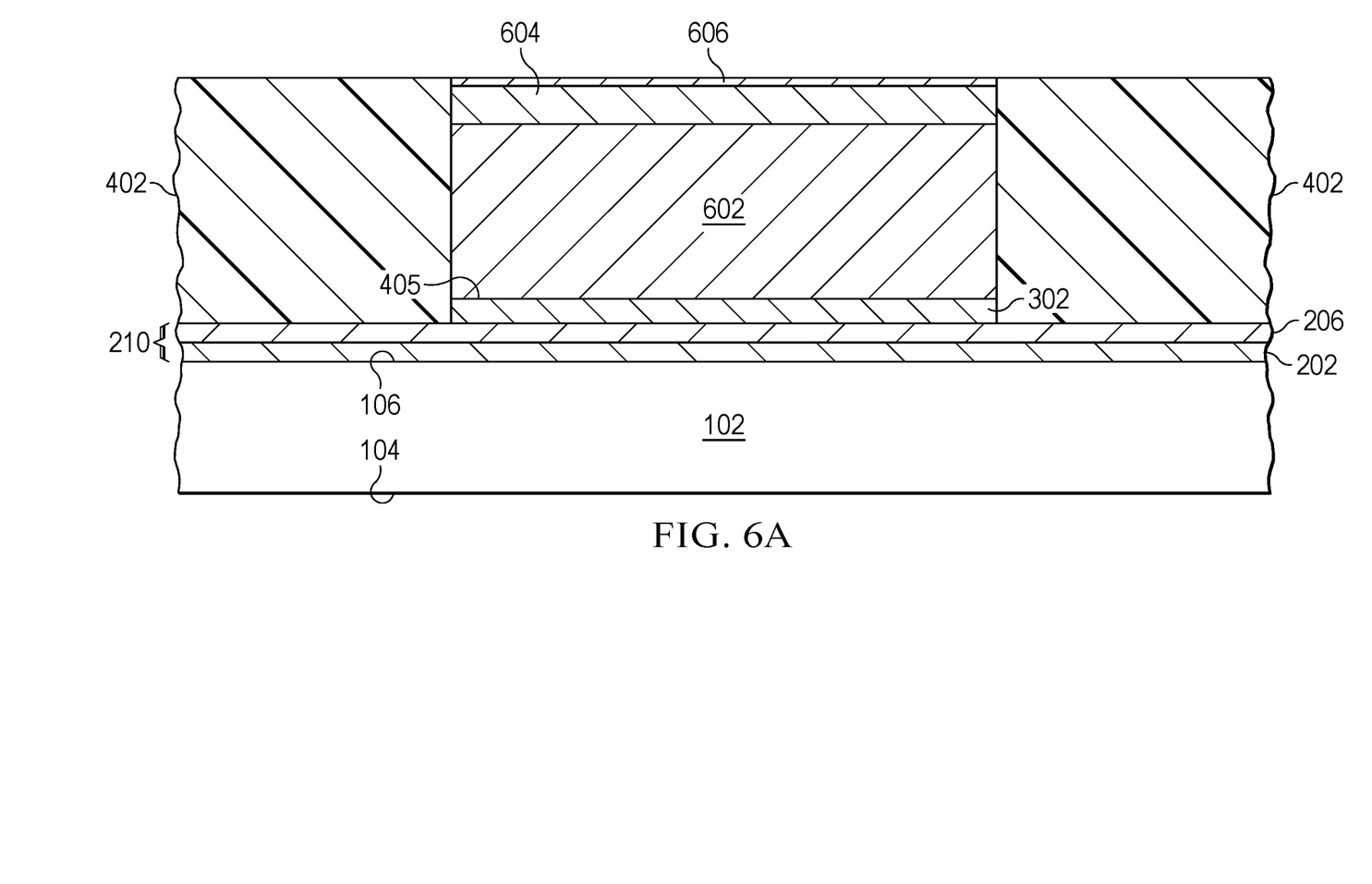
Figure 6B:
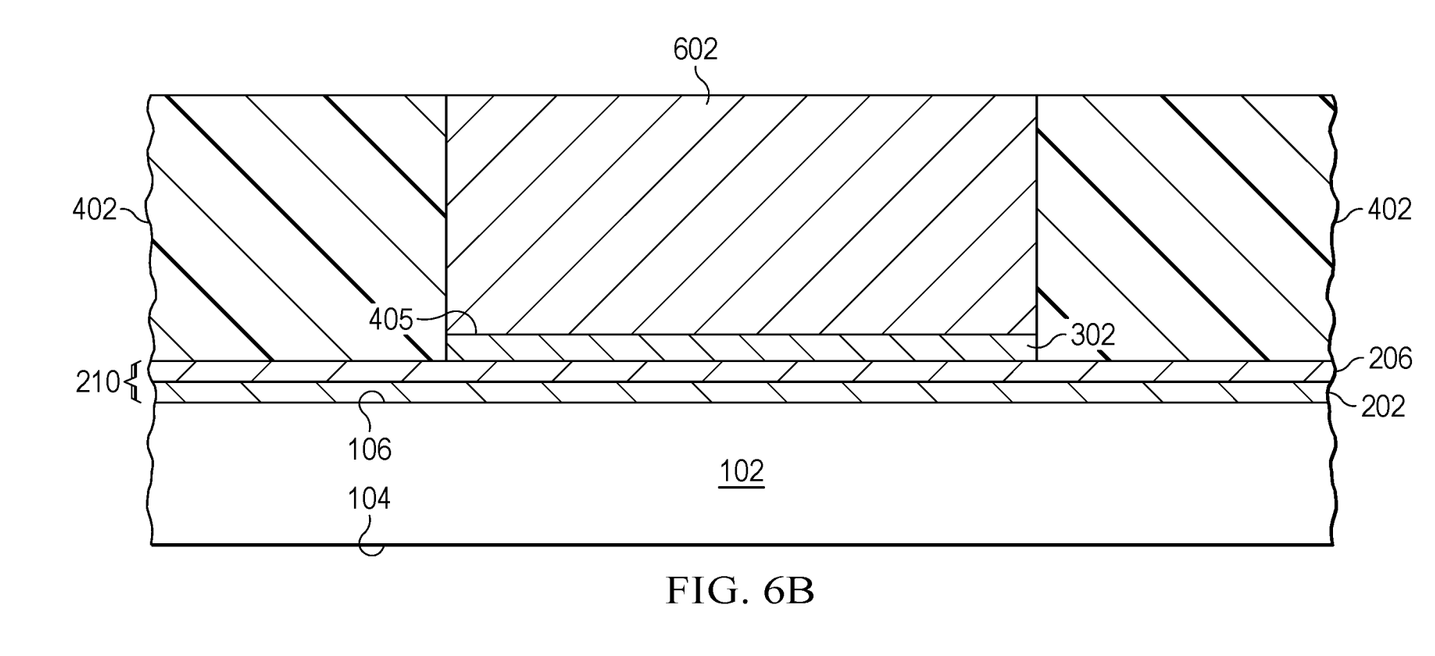
Figure 7A:
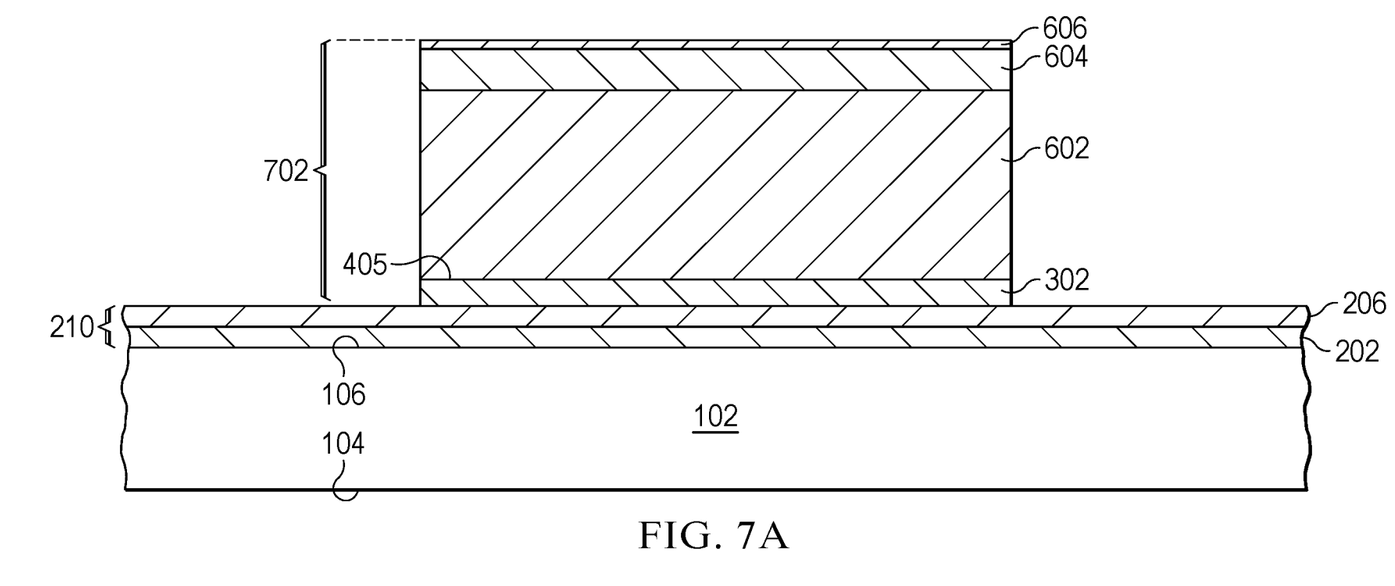
Figure 7B:
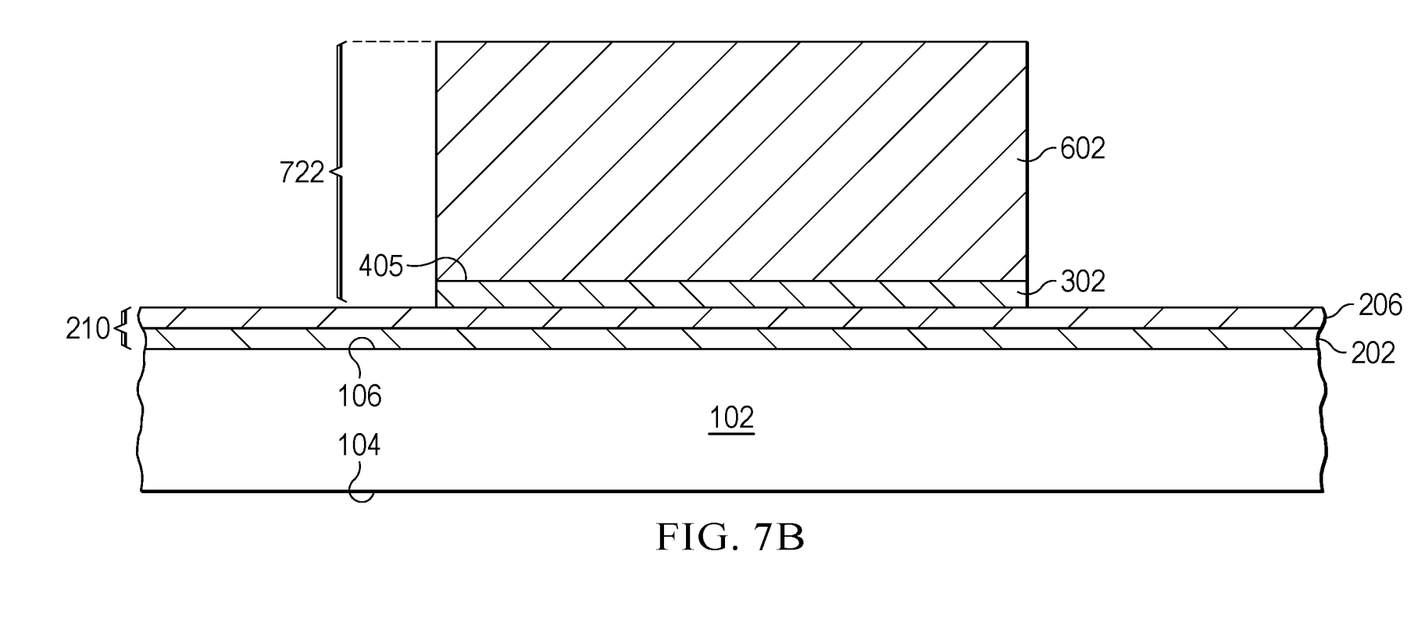

FIGS. 6A, 7A, 8A, and 9A illustrate the processing steps to form a BOAC pillar on metal layer 302, and FIGS. 6B, 7B, 8B, and 9B illustrate the processing steps to form a COA pillar on metal layer 302. In FIG. 6A, layer 602 is formed on metal layer 302, layer 604 is formed on layer 602, and layer 606 is formed on layer 604. In one example, layer 602 is Cu, layer 604 is Ni, and layer 606 is palladium (Pd). The layers 602, 604, and 606 may be plated via, for example, an electroplating process. In FIG. 6B, layer 602 (e.g., Cu) is formed (e.g., plated) on layer 302. In FIGS. 7A and 7B, the photoresist 402 is removed, for example, by a photoresist stripping process that targets the photoresist. In FIG. 7A, with layer 302, the metallization stack including layers 602, 604, and 606 forms a BOAC pillar 702 to which a bond wire, solder ball, or solder pad (not shown) may be attached. In FIG. 7B, with layer 302, the metallization stack including layer 602 forms a COA pillar 722 to which a solder bump (not shown) may be attached.

As shown in FIGS. 7A and 7B, metal layer 302 is sandwiched between layer 206 of the seed layer 210 and layer 602 of the respective pillars 702 and 722. In one example, metal layer 302 includes one type of metal and layers 210 and 602 include a different, but the same, type of metal. In the example above, metal layer 302 includes Ni and layers 210 and 602 include Cu. The conductive pillars 702 and 722 are over a surface of the metal layer 302 opposite the seed layer 210.

Figure 8A:
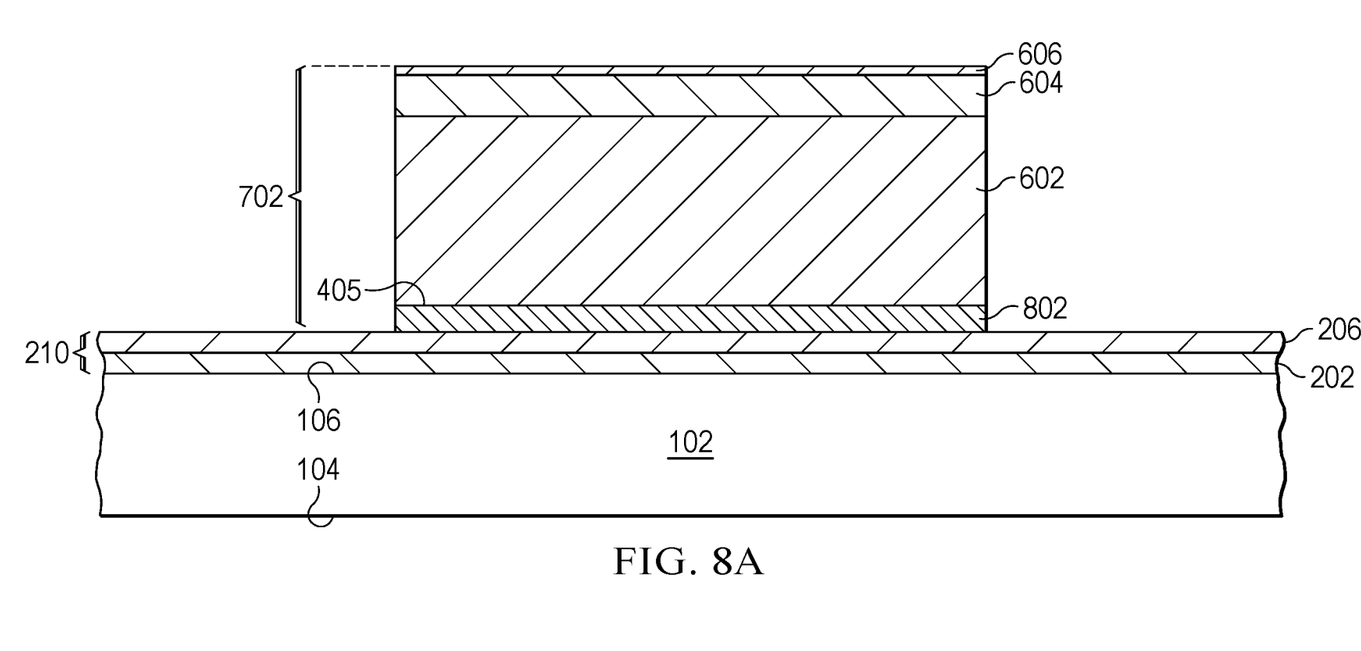
Figure 8B:
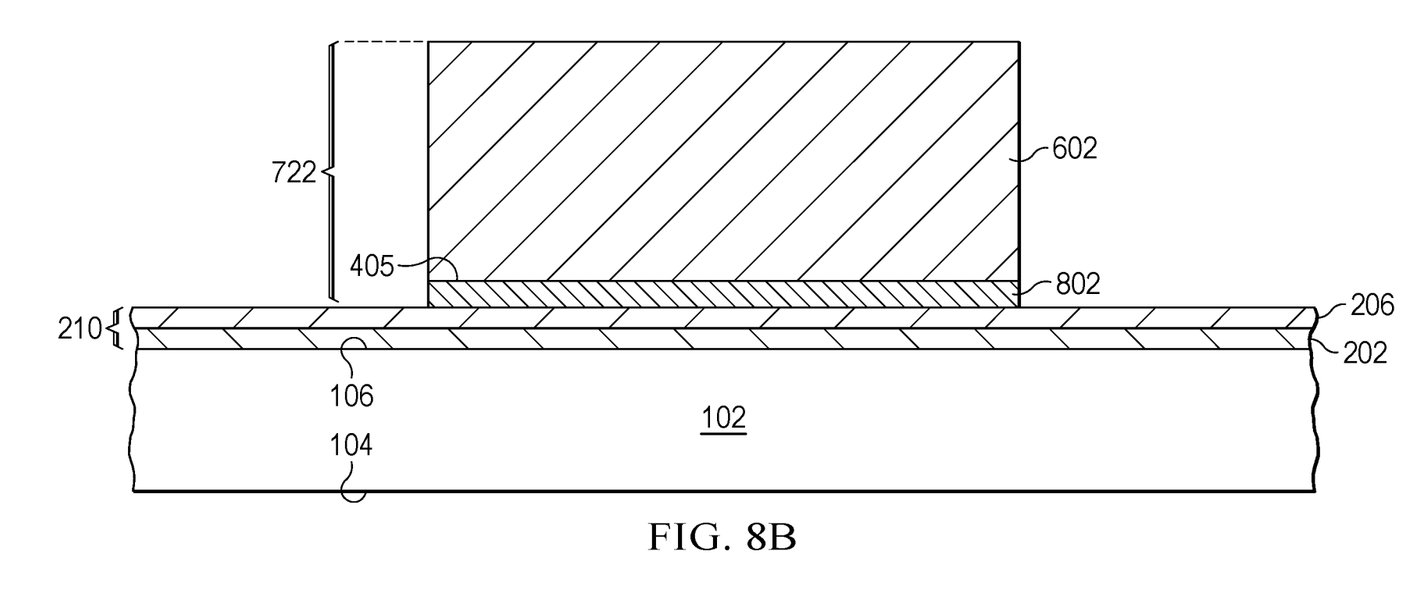

The wafer including the structures shown in FIG. 7A or 7B is then processed to convert at least a portion, or all, of metal layer 302 into an alloy. FIGS. 8A and 8B show layer 302 as layer 802 in a different visual representation than layer 302 in the previous figures (FIGS. 3-7B) to indicate the conversion of the single metal layer 302 into the alloy. In one example, the processing of the wafer includes heating the wafer to a sufficient temperature to convert metal layer 302 into an alloy. In the example in which layer 302 includes Ni and layers 210 and 602 include Cu, layer 302 is converted from Ni to a Ni—Cu alloy by heating the wafer to a temperature in the range of approximately 300-400 degrees Celsius.

Figure 9A:
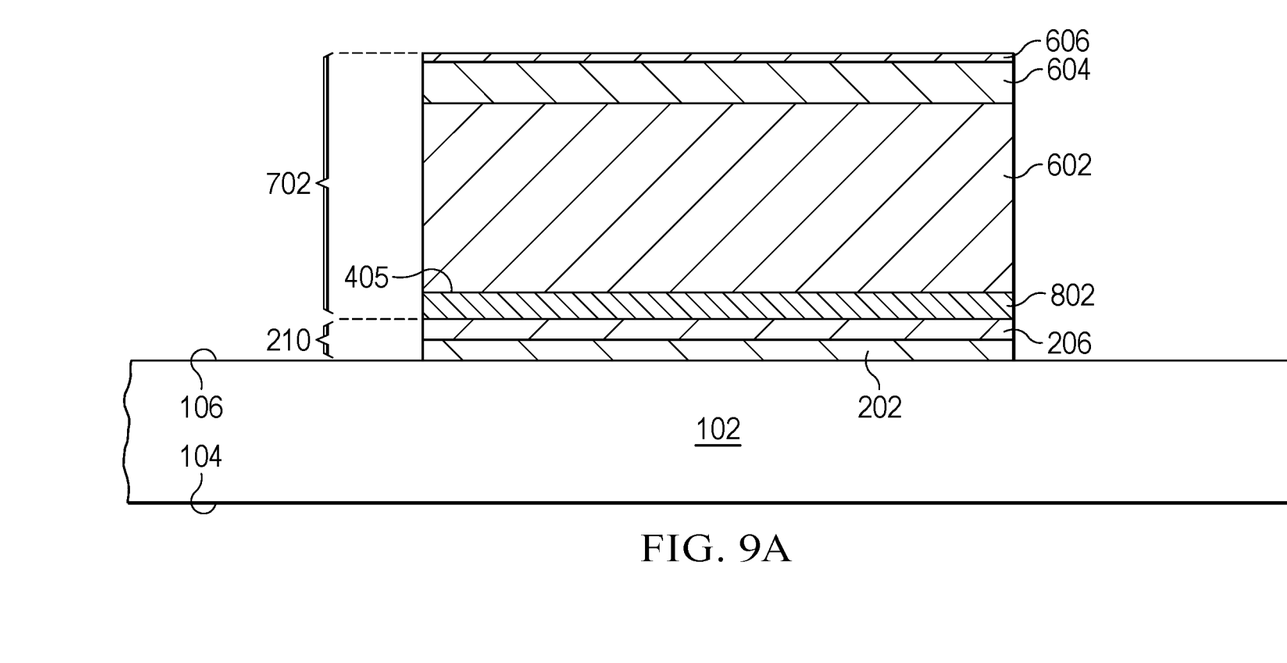
Figure 9B:
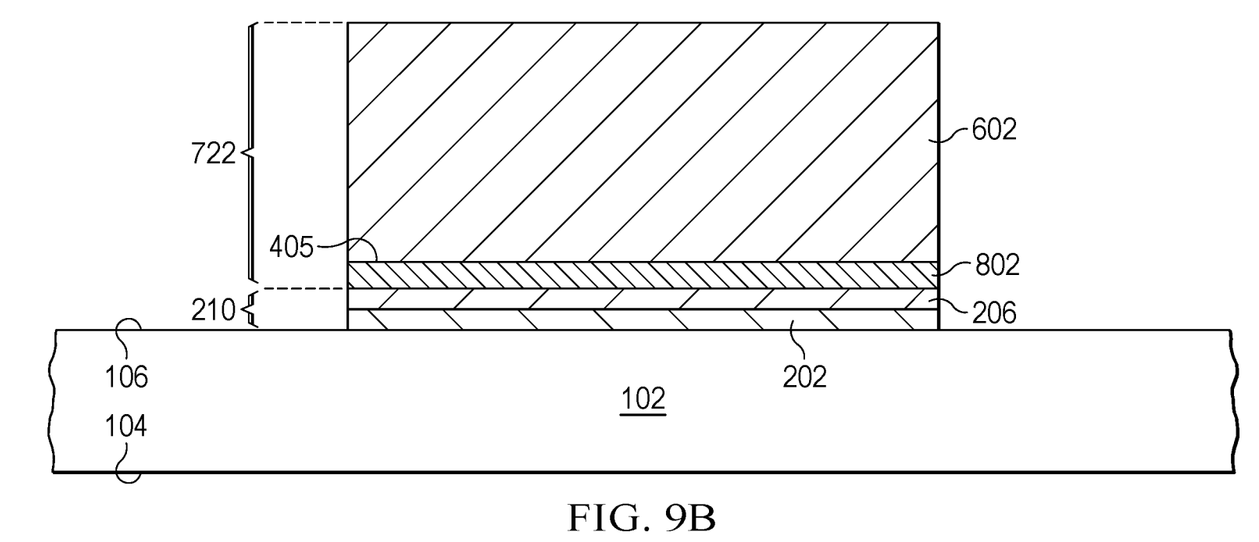

In FIGS. 9A and 9B, the wafer is subjected to a wet etching process to remove the seed layer 210 other than between underneath the pillars 702 and 722. The wet etching process may include the use of an acid (e.g., sulphuric acid). The alloy layer 802 is resistant to the acid used in the wet etching process to remove the seed layer 210 and thus helps to prevent or at least reduce the amount of the portion of the seed layer 210 underneath the pillars 702 and 722 from being removed during the wet etching process.

Figure 10A:
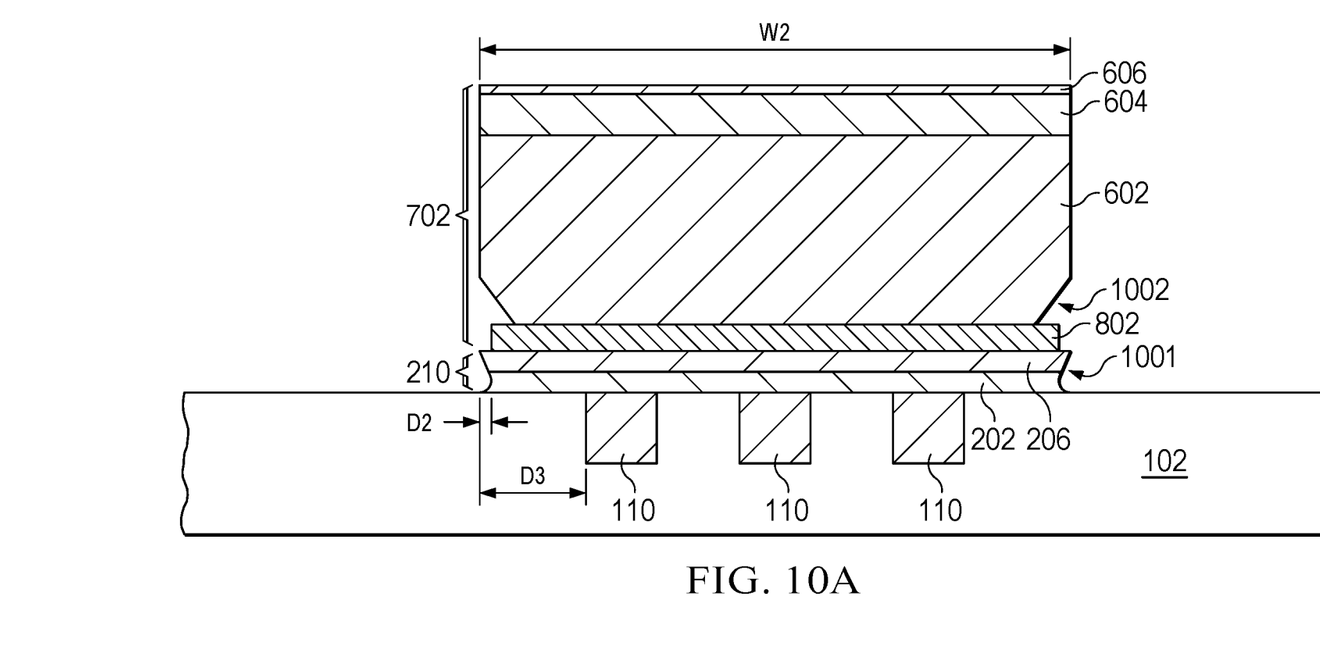
FIG. 10A is a cross-sectional view of a die with the BOAC pillar, in an example.
Figure 10B:
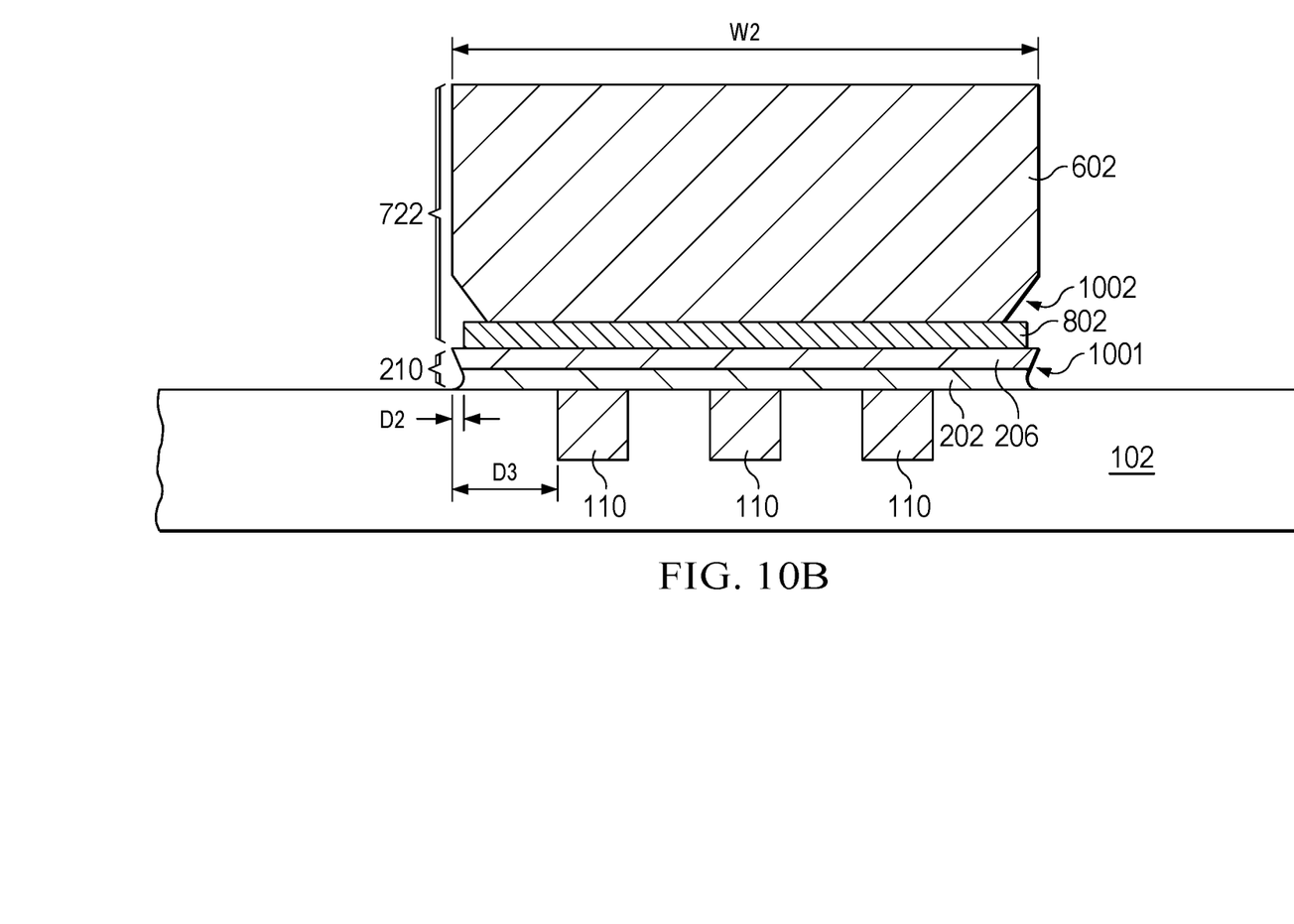
FIG. 10B is a cross-sectional view of a die with the COA pillar, in an example.

FIGS. 10A and 10B are cross-sectional views of the die 102 with the BOAC pillar 702 and COA pillar 722, respectively, formed thereon as described above. FIGS. 10A and 10B show that a small amount D2 of an undercut 1001 of seed layer 210 may occur underneath the pillar 702 despite the presence of the alloy layer 802. However, all else being equal (e.g., time of wet etching process, type of acid used, etc.), the size D1 of the undercut 125 in FIG. 1 without the protective alloy layer 802 is larger than the size D2 of the undercut 1001 with the protective alloy 802. The smaller undercut 1001 resulting from the inclusion of the alloy 802 permits the distance D3 between the edge of the pillar 702 and the closest via 110 to be smaller than would be the case without the alloy layer 802, which means that pillar 702 can have a smaller width W2 than width W1 of the pillar in FIG. 1 without the alloy layer 802.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A method, comprising:
   forming a seed layer on a substrate, the seed layer including a first metal;
   forming a first metal layer over the seed layer, the first metal layer including a second metal;
   forming a second metal layer over the first metal layer, the second metal layer including the first metal;
   converting at least a portion of the first metal layer into an alloy of the first metal and the second metal; and
   etching the seed layer.

2. The method of claim 1, further comprising:
   forming a third metal layer over the second metal layer; and
   forming a fourth metal layer over the third metal layer;
   wherein the second metal is nickel, the third metal layer includes nickel, the first metal is copper, and the fourth metal layer includes palladium.

3. The method of claim 1, wherein forming the first metal layer comprises selectively sputter depositing the first metal layer on the seed layer.

4. The method of claim 1, wherein the first metal is copper, and the seed layer also includes a layer including titanium and tungsten.

5. The method of claim 1, wherein converting the at least the portion of the first metal layer into the alloy comprises applying heat.

6. The method of claim 1, wherein converting the at least the portion of the first metal layer into the alloy comprises heating the first metal layer to a temperature in a range of approximately 300 degrees Celsius to approximately 400 degrees Celsius.

7. The method of claim 1, wherein etching the seed layer comprises applying an acid to the seed layer.

8. The method of claim 1, wherein forming the second metal layer on the first metal comprises:
   applying a photoresist;
   applying a mask;
   developing the photoresist to expose at least a portion of the first metal layer; and
   plating the second metal layer on the exposed portion of the first metal layer.

9. The method of claim 1, wherein the first metal is copper.

10. The method of claim 9, wherein the second metal is nickel.

* * * * *